United States Patent
Kim et al.

(10) Patent No.: US 8,652,876 B2
(45) Date of Patent: Feb. 18, 2014

(54) METHOD OF MANUFACTURING PRAM USING LASER INTERFERENCE LITHOGRAPHY

(71) Applicant: Korea Institute of Science and Technology, Seoul (KR)

(72) Inventors: Young Hwan Kim, Seoul (KR); Yong Tae Kim, Gyeonggi-do (KR); Jinn Il Choi, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 13/672,943

(22) Filed: Nov. 9, 2012

(65) Prior Publication Data
US 2013/0224908 A1    Aug. 29, 2013

(30) Foreign Application Priority Data

Feb. 29, 2012   (KR) .................. 10-2012-0021214

(51) Int. Cl.
*H01L 45/00* (2006.01)

(52) U.S. Cl.
USPC .......................................... 438/102

(58) Field of Classification Search
USPC .......................................... 438/102
See application file for complete search history.

(56) References Cited

U.S. PATENT DOCUMENTS 7,892,936 B1 *   2/2011   Wu et al. .................. 438/385

FOREIGN PATENT DOCUMENTS

| JP | 2003-303941 A | 10/2003 |
| JP | 2007-262510 A | 10/2007 |
| KR | 100512141 B1 | 8/2005 |
| KR | 10-0803743 B1 | 2/2008 |
| KR | 1020090039145 A | 4/2009 |

* cited by examiner

*Primary Examiner* — Alexander Ghyka
*Assistant Examiner* — Stanetta Isaac
(74) *Attorney, Agent, or Firm* — Ladas & Parry LLP

(57) ABSTRACT

A method of manufacturing a phase-change random access memory includes: sequentially depositing an insulating layer, a first electrode layer, a phase change material layer, and a transfer material layer on a substrate; forming an array pattern in the transfer material layer using a laser interference lithography process; forming a metal layer on the transfer material layer having the array pattern formed; forming a second electrode layer by removing the transfer material layer; and forming a phase change layer by etching the phase change material layer using the second electrode layer as a mask. Accordingly, the manufacturing process of the phase-change random access memory may achieve an increase in speed and may be simplified.

6 Claims, 4 Drawing Sheets

METHOD OF MANUFACTURING PRAM USING LASER INTERFERENCE LITHOGRAPHY

CROSS-REFERENCE TO RELATED APPLICATION

This application claims priority to Korean Patent Application No. 10-2012-0021214, filed on Feb. 29, 2012, and all the benefits accruing therefrom under 35 U.S.C. §119, the contents of which in its entirety are herein incorporated by reference.

BACKGROUND

1. Field

The present disclosure relates to a method of manufacturing a phase-change random access memory using laser interference lithography, and more particularly, to a method of manufacturing a phase-change random access memory capable of forming a nanoscale pattern over a large area using laser interference lithography.

2. Description of the Related Art

A phase-change random access memory (PRAM) is the next-generation memory semiconductor which stores data by determining a phase change in a particular material. The phase-change random access memory has advantages of both a flash memory in which stored information is not erased even though power is turned off and a dynamic random-access memory (DRAM) which has a high processing speed.

The phase-change random access memory includes phase change materials representing two or more different states, and the states of the phase change materials include amorphous and crystalline states. Generally, the crystalline state has an ordered lattice structure while the amorphous state has a disordered structure. These two crystalline states have different resistances, and a phase change occurs in response to a temperature change. Therefore, the phase change may be used to store data bits.

In order to minimize the amount of voltage used in a cell of the phase-change random access memory, the cross-section of the path of a current passing through the phase change material has to be minimized. Therefore, in a case of a memory array having a plurality of memory cells, a patterning technique capable of implementing fine line widths on the order of nanometers is required.

As a method of implementing fine line widths on the order of nanometers, electron beam lithography, focused ion beam lithography, nanoimprint lithography, and the like are used.

However, in the case of the electron beam lithography and focused ion beam lithography processes, although ultrafine patterns are able to be implemented, there is a difficulty in implementing a memory array structure having a plurality of cells over a large area.

In addition, in the case of the nanoimprint lithography process, additionally required stamps are typically manufactured by the electron beam lithography, and thus there is a problem in that great manufacturing cost and time is consumed. In addition, in the case of the nanoimprint lithography process, residual layers are generated after imprinting, and thus there is a problem in that an additional etching process for removing the layers is needed.

SUMMARY

The present disclosure is directed to providing a method of manufacturing a phase-change random access memory using laser interference lithography capable of achieving large-area patterning and minimizing manufacturing cost and time.

In one aspect, there is provided a method of manufacturing a phase-change random access memory including: sequentially depositing an insulating layer, a first electrode layer, a phase change material layer, and a transfer material layer on a substrate; forming an array pattern in the transfer material layer using a laser interference lithography process; forming a metal layer on the transfer material layer having the array pattern formed; forming a second electrode layer by removing the transfer material layer; and forming a phase change layer by etching the phase change material layer using the second electrode layer as a mask.

In the array pattern formed in the transfer material layer, holes having a pillar shape may be arranged in a matrix form.

In the array pattern formed in the transfer material layer, grooves having a column shape may be arranged in a stripe form.

In the laser interference lithography process, a size of the array pattern may be adjusted by controlling exposure energy.

In the forming of the phase change layer by etching the phase change material using the second electrode layer as the mask, the first electrode layer may be etched together.

The first electrode may include titanium nitride (TiN), the phase change material layer include $Ge_aSb_bTe_c$ (where a, b, and c may be respectively atomic molar fractions, $a+b+c=1$, and $0<a, b, c<1$), and the second electrode layer may include chromium (Cr).

By applying the laser interference lithography process to manufacture a cell array structure of the phase-change random access memory as described above, a uniform nanostructure may be obtained, and large-area patterning is possible. In addition, an additional electron beam lithography process is unnecessary, and an additional process for removing residual layers that are generated during a nanoimprint lithography process is unnecessary. Therefore, the process may achieve an increase in speed and simplification. Moreover, when the laser interference lithography is applied, the pattern size may be reduced through exposure energy.

BRIEF DESCRIPTION OF THE DRAWINGS

The above and other aspects, features and advantages of the disclosed exemplary embodiments will be more apparent from the following detailed description taken in conjunction with the accompanying drawings in which.

| [Detailed Description of Main Elements] | |
|---|---|
| 10: substrate | 30: insulating layer |
| 50: first electrode | 20: phase change material layer |
| 40: transfer material layer | 41: protruding pattern |
| 45: groove pattern | 60: metal layer |
| 70: second electrode layer | 90: phase change layer |

DETAILED DESCRIPTION

Hereinafter, exemplary embodiments of a method of manufacturing a phase-change random access memory using a laser interference lithography process of the disclosure will be described in detail with reference to the drawings.

Figure 2:
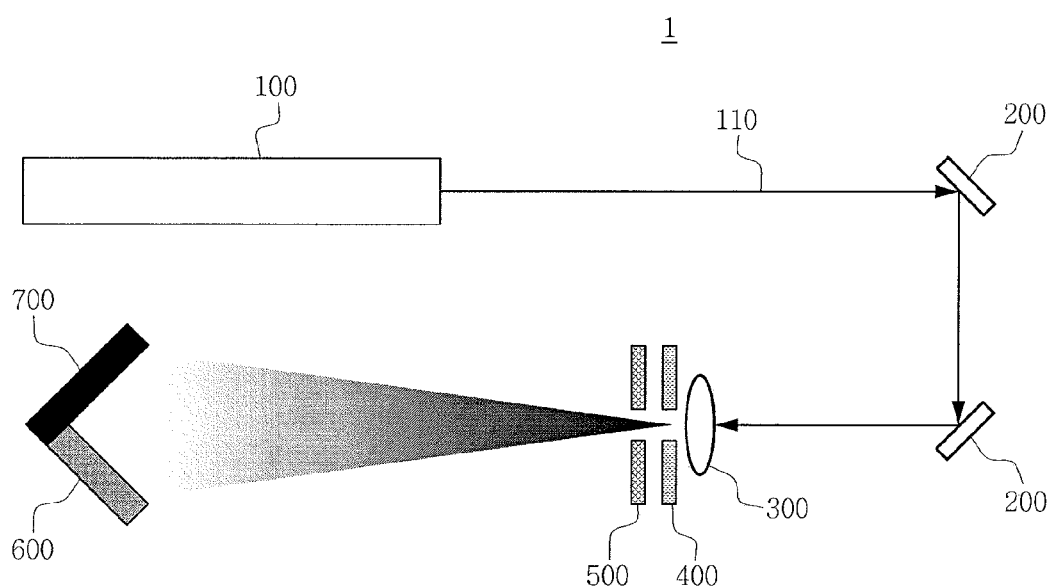
FIG. 2 is a schematic diagram of an apparatus used for a laser interference lithography process.
Figure 3A:
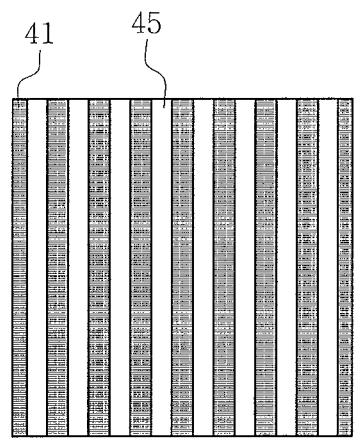
FIGS. 3A and 3B are plan views showing patterns formed by the laser interference lithography process.
Figure 3B:
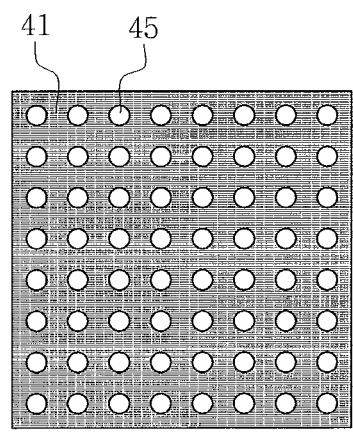

FIGS. 1A to 1G are cross-sectional views for explaining a method of manufacturing a phase-change random access memory according to an embodiment of the disclosure. FIG. 2 is a schematic diagram of an apparatus used for a laser interference lithography process. FIGS. 3A and 3B are plan views showing patterns formed by the laser interference lithography process.

Figure 1A:
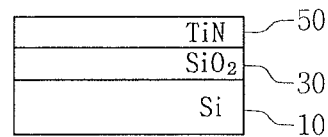
FIGS. 1A to 1G are cross-sectional views for explaining a method of manufacturing a phase-change random access memory according to an embodiment of the disclosure.

Referring to FIG. 1A, in the method of manufacturing a phase-change random access memory according to the embodiment of the disclosure, an insulating layer 30 and a first electrode layer 50 are formed on a substrate 10.

The substrate 10 may include silicon (Si), and the insulating layer 30 may include silicon oxide ($SiO_2$) or silicon nitride ($SiN_x$). For example, the insulating layer 30 may be deposited with a thickness of about 300 nm.

The insulating layer 30 may be deposited by a method such as an atmospheric pressure chemical vapor deposition (APCVD), low-pressure chemical vapor deposition (LPCVD), or plasma-enhanced chemical vapor deposition (PECVD).

The first electrode 50 is deposited on the insulating layer 30 formed on the substrate 10. The first electrode 50 may include at least one of aluminum (Al), silver (Ag), gold (Au), titanium (Ti), copper (Cu), tungsten (W), chromium (Cr), tin (Sn), and titanium nitride (TiN). For example, the first electrode layer 50 is formed of titanium nitride (TiN), and may be deposited with a thickness of about 200 nm.

Figure 1B:
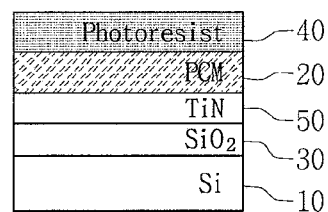

Referring to FIG. 1B, a phase change material layer 20 and a transfer material layer 40 are formed on the first electrode layer 50.

The phase change material layer 20 may include at least one of tellurium (Te), selenium (Se), germanium (Ge), antimony (Sb), bismuth (Bi), lead (Pb), tin (Sn), arsenic (As), indium (In), gold (Ag), sulfur (S), silicon (Si), phosphorus (P), and oxygen (O). For example, the phase change material layer 20 may include $Ge_aSb_bTe_c$ (where a, b, and c are respectively atomic molar fractions, a+b+c=1, and 0<a, b, c<1) or $In_dSb_eTe_f$ (where d, e, and f are respectively atomic molar fractions, d+e+f=1, and 0<d, e, f<1).

The transfer material layer 40 is irradiated with light, the part irradiated with light may be a photoresist which is insoluble or soluble in a developing solution, and the photoresist may be applied by a spin coating process. In a case where the photoresist is of a negative type, the part irradiated with light remains, and in a case where the photoresist is of a positive type, the part irradiated with light is removed.

Figure 1C:
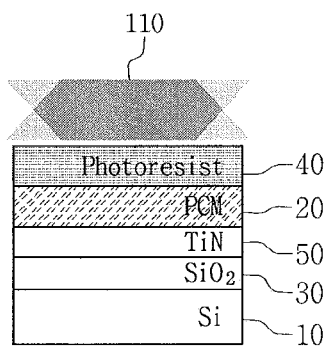

Referring to FIG. 1C, the transfer material layer 40 is exposed using a laser interference lithography process.

In the laser interference lithography process, masks are unnecessary and exposure is directly performed. Therefore, the process is simple, and large-area patterning is possible.

Referring to FIG. 2, a laser interference lithography process apparatus 1 may include a light source 100, at least one deflection mirror 200, a spatial filter 300, a pinhole 400, an aperture 500, a reflection mirror 600, and a sample frame 700.

First, the direction of a laser beam 110 output from the light source 100 is changed by the deflection mirror 200. The deflection mirror 200 may be one or more, and may be installed as necessary for the deflection of the laser beam 110.

The laser beam 110 deflected by the deflection mirror 200 is expanded by the spatial filter 300. For example, the laser beam 110 may be expanded about 20 to 25 times while passing through the spatial filter 300. In addition, noises are reduced by the pinhole 400, and only a region with a predetermined light intensity is selected by the aperture 500 for exposure.

The laser beams 110 that irradiate the reflection mirror 600 and the sample frame 700 to which a body to be exposed is mounted make interference and form a regular pattern over a large area. The angle between the reflection mirror 600 and the sample frame 700 may be 90 degrees.

Figure 1D:
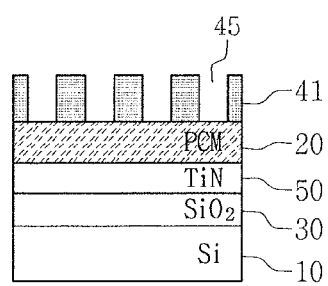

Referring to FIG. 1D, an array pattern is formed on the transfer material layer 40 by the laser interference lithography process of FIG. 1C.

In the array pattern, a protruding pattern 41 and a groove pattern 45 may be repeatedly formed. In a case where the transfer material layer 40 is of a negative type, the part irradiated with the laser beam 110 becomes the protruding pattern 41, and in a case where the transfer material layer 40 is of a positive type, the part irradiated with the laser beam 110 becomes the groove pattern 45.

Referring to FIG. 3A, an example of a one-dimensional pattern having column shapes formed after primary exposure using the laser interference lithography process is shown.

The pattern having the column shapes is a pattern arranged in a predetermined direction and has a stripe form in a plan view. In the pattern having the column shapes, the protruding pattern 41 and the groove pattern 45 may be repeatedly formed. In the case where the transfer material layer 40 is of the positive type, the part irradiated with the laser beam 110 becomes the groove pattern 45 having the column shapes.

In addition, referring to FIG. 3B, a two-dimensional pattern having pillar shapes formed after secondary exposure using the laser interference lithography process is shown. Here, the pattern expressed by the pillar shapes includes a two-dimensional pattern having hole shapes in the reverse direction. This is because the pattern formed according to the type of the transfer material layer 40 may have the pillar shapes or may also have the hole shapes.

In this case, after the sample frame 700 is rotated by 90 degrees after the primary exposure, the secondary exposure may be performed. Otherwise, after the direction of the irradiated laser beam 110 is rotated by 90 degrees, the secondary exposure may be performed.

The pattern having the pillar shapes is a pattern arranged in a matrix form, and for example, a dot array form in a plan view. In the case where the transfer material layer 40 is of the positive type, the part irradiated with the laser beam 110 becomes the groove pattern 45 having the dot array form.

In this embodiment, it is described that the planar shape of the pattern is the shape of a dot, that is, a circle. However, the shape may be elliptical, polygonal, amorphous, and the like, and is not limited. In addition, the pillar may be a cylinder, a cylindroid, a polyprism, an amorphous prism, and the like, and the shape thereof is not limited. The pattern shapes of FIGS. 3A and 3B are only examples, and various shapes of patterns may be formed according to an exposure method.

For example, in this embodiment, a pattern having a period of about 200 nm (the pattern size is smaller than or equal to about 100 nm) at the minimum using a krypton fluoride (KrF) excimer laser having a wavelength of about 248 nm as the light source 100 of laser interference lithography may be formed. Furthermore, when exposure energy is controlled, the pattern size may be reduced to about 25% to 30% of the period, and thus a pattern having a period of about 60 nm at the minimum may be formed.

In addition, a pattern with uniform nanometer sizes may be formed on an area of 5 cm×5 cm or greater, and the array structure of the phase-change random access memory may be manufactured by performing dry etching.

For example, a time taken to perform the laser interference lithography process is dependent on power, and a pattern at a grade of 100 nm or less with a two-dimensional pillar shapes may be obtained by performing primary exposure for 30 seconds at the minimum and secondary exposure for 30 seconds at the minimum.

Figure 1E:
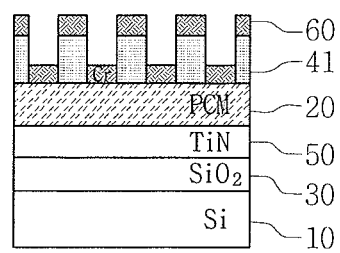

Referring to FIG. 1E, a metal layer 60 is formed on the transfer material layer 40 having the array pattern formed.

The metal layer 60 is deposited on the protruding pattern 41 of the transfer material layer 40, and is also deposited on the phase change material layer 20 inside the groove pattern 45 of the transfer material layer 40. Thereafter, the metal layer 60 formed on the protruding pattern 41 of the transfer material layer 40 is removed, and the metal layer 60 formed on the phase change material layer 20 inside the groove pattern 45 of the transfer material layer 40 forms a secondary electrode layer 70.

The metal layer 60 may include at least one of aluminum (Al), silver (Ag), gold (Au), titanium (Ti), copper (Cu), tungsten (W), chromium (Cr), tin (Sn), and titanium nitride (TiN). For example, the metal layer 60 is formed of chromium (Cr), and may be deposited with a thickness of about 200 nm.

Figure 1F:
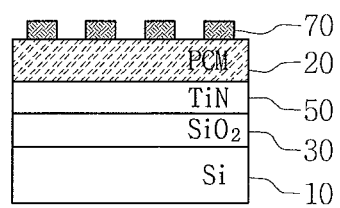

Referring to FIG. 1F, the second electrode layer 70 is formed by removing the transfer material layer 40.

The transfer material layer 40 may be removed through a lift-off process, and in this case, the metal layer 60 formed on the protruding pattern 41 of the transfer material layer 40 may be removed together.

Only the metal layer 60 formed on the phase change material layer 20 inside the groove pattern 45 of the transfer material layer 40 remains, and the pattern of the remaining metal layer 60 becomes the second electrode layer 70. Therefore, the second electrode layer 70 may have the same pattern as the groove pattern 45 as viewed in the plan view.

Figure 1G:
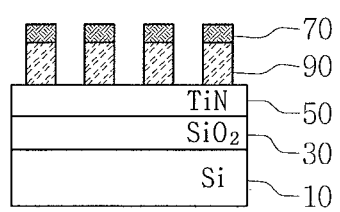

Referring to FIG. 1G, the phase change material layer 20 is etched using the second electrode layer 70 as a mask, thereby forming a phase change layer 90.

The phase change material layer 20 may be etched by a dry etching method, and the phase change material layer 20 is removed except for the lower portion thereof on which the second electrode layer 70 is formed. Therefore, the phase change layer 90 is formed at the lower portion of the second electrode layer 70.

The phase change layer 90 becomes the path of a current between the first electrode layer 50 and the second electrode layer 70.

Hereinafter, the operations of a phase-change random access memory element formed by the method of manufacturing a phase-change random access memory will be described.

The phase-change random access memory element is an element that uses a difference in electrical resistance between crystalline and amorphous phases of a phase change material as a signal, and the phase-change random access memory element having such a principle has a property of maintaining the state of programmed data as it is even after the signal is removed. Therefore, the phase-change random access memory element has an advantage of being usable as a non-volatile memory element.

In addition, unlike a general memory element according to the related art, which is able to be programmed using only two bits representing 0 and 1 through a single unit cell, the phase-change random access memory element has an advantage of being able to be programmed using multiple bits as well as two bits and thus has further enhanced usability.

Regarding the phase change material, in a case where the phase of the phase-change random access memory element is the crystalline phase, electrical conductivity is high, and in a case where the phase is the amorphous phase, electrical conductivity is low. Since the state of the phase is determined according to a temperature change in the phase change material, heat for a temperature change is needed in order to generate a phase change. Such heat is generated by Joule heating by which an electric current is caused to flow through an electrical resistor.

In addition, a phase change in the phase-change random access memory significantly depends on the density of an electrical current that flows during the phase change. That is, variables related to a reduction in power and high integration of the phase-change random access memory element including threshold current, threshold voltage, reset current, and the like significantly depend on the density of an electric current that flows between the phase change layer 90 and the lower electrode (the second electrode layer 70). In a case where the same amount of current flows through a phase change material, a higher current density may be achieved by reducing contact area.

The magnitude of a current required during writing and erasing operations is influenced by a contact area between the phase change material and a contact material. As the contact area is reduced, the volume of an area of the phase change material that actually participates in a phase change is reduced, and thus energy needed for the phase change is also reduced. In addition, as the contact area is reduced, the size of a unit cell is reduced, resulting in an improvement in the degree of integration of a memory element.

According to the method of manufacturing a phase-change random access memory according to the disclosure, the manufacturing process of the phase-change random access memory element may achieve an increase in speed and may be simplified, and accordingly manufacturing cost may be reduced. In addition, uniform patterning over a large area is possible, and by minimizing the contact area between the phase change layer 90 and the second electrode layer 70, the efficiency and the degree of integration of the phase-change random access memory element may be increased.

While the exemplary embodiments have been shown and described, it will be understood by those skilled in the art that various changes in form and details may be made thereto without departing from the spirit and scope of the present disclosure as defined by the appended claims.

What is claimed is:

1. A method of manufacturing a phase-change random access memory comprising:
   sequentially depositing an insulating layer, a first electrode layer, a phase change material layer, and a transfer material layer on a substrate;
   forming an array pattern in the transfer material layer using a laser interference lithography process;
   forming a metal layer on the transfer material layer having the array pattern formed;
   forming a second electrode layer by removing the transfer material layer; and
   forming a phase change layer by etching the phase change material layer using the second electrode layer as a mask.

2. The method according to claim 1,
   wherein, in the array pattern formed in the transfer material layer, holes having a pillar shape are arranged in a matrix form.

3. The method according to claim 1,
   wherein, in the array pattern formed in the transfer material layer, grooves having a column shape are arranged in a stripe form.

4. The method according to claim 1,
wherein, in the laser interference lithography process, a size of the array pattern is adjusted by controlling exposure energy.

5. The method according to claim 1,
wherein, in said forming of the phase change layer by etching the phase change material using the second electrode layer as the mask, the first electrode layer is etched together.

6. The method according to claim 1,
wherein the first electrode includes titanium nitride (TiN),
the phase change material layer includes $Ge_aSb_bTe_c$ (where a, b, and c are respectively atomic molar fractions, a+b+c=1, and 0<a, b, c<1), and
the second electrode layer includes chromium (Cr).

* * * * *